United States Patent [19]

Isogai

[11] 4,369,503
[45] Jan. 18, 1983

[54] DECODER CIRCUIT

[75] Inventor: Hideaki Isogai, Higashikurume, Japan

[73] Assignee: Fujitsu Limited, Kawasaki, Japan

[21] Appl. No.: 232,008

[22] Filed: Feb. 6, 1981

[30] Foreign Application Priority Data

Feb. 8, 1980 [JP]  Japan .................................. 55-14576

[51] Int. Cl.³ .............................................. G11C 11/40
[52] U.S. Cl. ..................................... 365/189; 365/230
[58] Field of Search ................................ 365/189, 230

[56] References Cited

U.S. PATENT DOCUMENTS

| 3,736,574 | 5/1973 | Gersbach | 365/189 |
| 4,007,451 | 2/1977 | Heuber et al. | 365/174 |
| 4,027,285 | 5/1977 | Millhoilan et al. | 340/166 |

FOREIGN PATENT DOCUMENTS

| 19988 | 10/1980 | European Pat. Off. |
| 24894 | 11/1981 | European Pat. Off. |
| 2904457 | 7/1980 | Fed. Rep. of Germany |

OTHER PUBLICATIONS

Intel Corp. Bipolar LSI Memory 3102, 3202, "Partially Decoded Random Access 256 Bit Bipolar Memory (3102) and Binary Decoder Drives (3202)", Dec. 1970.
IEEE International Solid-State Circuits Conference, "High Density Memories", Quinn et al., Feb. 16, 1978, pp. 154-155.
IEEE Journal of Solid-State Circuits, "A Fast 7.5 NS Access 1K Bit Ram for Catch-Memory Systems", Kawarada et al., Oct. 1978, vol. SC-13, No. 5, pp. 656-663.
IEEE Transactions on Electron Devices, "Special Issue on Semiconductor Memory", Jun. 1979, vol. ED-26, No. 6, pp. 891-886.
IEEE Journal of Solid State Circuits, "ECL Look-Compatible 1024x4 Bit Ram W/15 NS Access Time", by Glock et al., vol. SC-14, Oct. 1979, No. 5, pp. 850-854.
IEEE Journal of Solid-State Circuits, "A High Speed ECL Look Compatable 64x4 Bit Ram w/bns Access Time", by Ernst et al., vol. SC-15, Jun. 1980, No. 3, pp. 306-310.

Primary Examiner—Terrell W. Fears
Attorney, Agent, or Firm—Staas & Halsey

[57] ABSTRACT

A decoder circuit which receives a plurality of address signals and selects one of the n×m word lines for driving a semiconductor memory device. The decoder circuit includes a high level selection circuit which receives the upper address signals and produces n outputs, one of the n outputs is selected to be a high level, while the other (n−1) outputs are rendered at a low level. The decoder circuit also includes a low level selection circuit which receives the lower address signals and produces m outputs, one of the m outputs is selected to be the low level, while the other (m−1) outputs are rendered at the high level. The decoder circuit additionally includes n×m coupling circuits each of which receives one output from the high level selection circuit and one output from the low level selection circuit and which corresponds to one of the n×m word lines. Each of the coupling circuit selects the corresponding word line when the high level output from the high level selection circuit and the low level output from the low level selection circuit are simultaneously applied to the coupling circuit.

11 Claims, 6 Drawing Figures

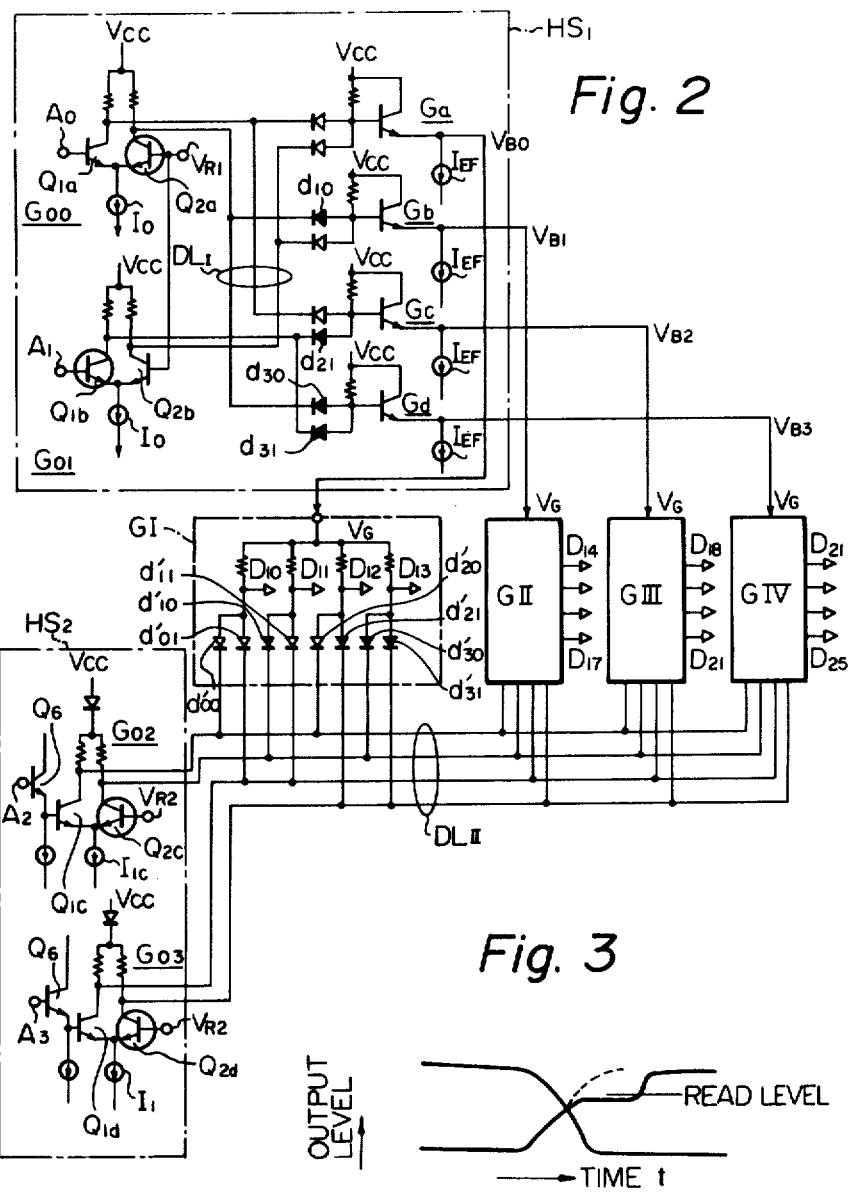
Fig. 2
Fig. 3

DECODER CIRCUIT

BACKGROUND OF THE INVENTION

The present invention relates to a decoder circuit for a semiconductor memory device, which comprises a combination of a high level selection circuit and a low level selection circuit so as to attain the requirements of low power consumption and high speed operation.

In the prior art, there are mainly three types of decoder circuits, i.e., a decoder circuit constructed by a high level selection circuit (hereinafter referred to as an H decoder), a decoder circuit constructed by a low level selection circuit (hereinafter referred to as an L decoder), and a decoder circuit constructed of two stages of high level selection circuits (hereinafter referred to as a two-stage H decoder). The H decoder has an advantage of simplified gate circuits, but consumes a relatively large amount of electric power in comparison with other types of decoders because, when one of the outputs of the decoder is to be selected, the other outputs must be grounded by conducting currents through elements connected between the other outputs and the ground. The L decoder has an advantage of relatively low power consumption in comparison with the other types of decoders because, when one of the outputs of the decoder is to be selected, only that one output must be grounded. However, the L decoder has a disadvantage of a limited number of input gates because of its circuit structure.

As a two-stage H decoder, Japanese Patent Application No. 50-84820 (Japanese Patent Laid-Open No. 52-8739) discloses, as hereinafter described in detail, a system which utilizes emitter coupled logic (ECL) and a diode (or a mutli-emitter) matrix, and which selects or does not select the diode matrix in a two-dimensional manner or higher dimensional manner, in order to reduce the consumption of electric power and to reduce the number of elements in the decoder circuit.

The decoder circuit mentioned above is advantageous with regard to reduced power consumption and reduced number of elements as compared with the conventional decoder circuit, but presents the defect that the output waveform has a distortion because of low driving capacity of the high level selection circuit. Therefore, when the reading level is higher than a point at which the output waveform rises slowly, the access time tends to be delayed. Further, in the above mentioned decoder circuit, although power consumption is reduced by employing the emitter coupled logic ECL and a diode (or a multi-emitter) matrix, it is still desirable to reduce the power consumption in a decoder circuit.

SUMMARY OF THE INVENTION

An object of the present invention is to provide a decoder circuit which consumes relatively low electric power as compared to conventional decoders.

Another object of the present invention is to provide a decoder circuit having output waveforms which rise and fall rapidly without any distortion.

Still another object of the present invention is to provide a decoder circuit which can operate at high speed.

The above-mentioned objects can be achieved by a decoder circuit which receives a plurality of address signals and selects one of $n \times m$ word lines for driving a semiconductor memory device. The decoder includes a high level selection circuit which receives a part of the plurality of address signals, and which produces one high level output for specifying one of n word line groups, and which produces $(n-1)$ low level outputs for the rest of the n word line groups. The decoder circuit also includes a low level selection circuit which receives the rest of the plurality of address signals, and which produces one low level output for specifying one of m word line groups, and which produces $(m-1)$ high level outputs for the rest of the m word line groups. The decoder circuit additionally includes $n \times m$ coupling circuits each of which receives one output from the high level selection circuit and one output from the low level selection circuit and which corresponds to one of said $n \times m$ word lines, each of the coupling circuits to selecting the corresponding word line when the high level output from the high level selection circuit and the low level output from the low level selection circuit are simultaneously applied to the coupling circuit.

It is preferable that each of the coupling circuits comprise a pnp transistor having an emitter connected to one of the outputs of the high level selection circuit, having a base connected to one of the outputs of the low selection circuit, and having collector connected to an one of $n \times m$ word drivers.

Further features and advantages of the present invention will be apparent from the ensuing description with reference to the accompanying drawings to which, however, the scope of the invention is in no way limited.

BRIEF DESCRIPTION OF THE DRAWINGS

FIG. 2 is a circuit diagram of a conventional two-stage H decoder constructed to deal with addresses consisting of four bits, used in the memory device of FIG. 1;

FIG. 3 is a graph illustrating the waveform of the circuit of FIG. 2;

DETAILED DESCRIPTION OF THE PREFERRED EMBODIMENT

Figure 1:
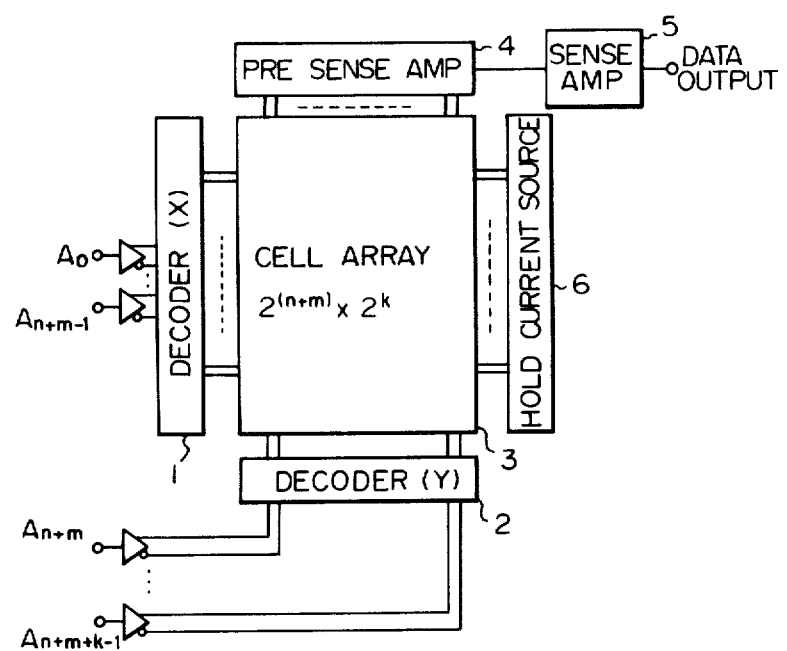
FIG. 1 is a block diagram of a memory device.

FIG. 1 illustrates construction of integrated circuit memory device. Referring to FIG. 1, a decoder (X) 1 and a decoder (Y) 2 are connected to a cell array 3. The decoder (X) 1 and the decoder (Y) 2 receive address signals $A_0 \ldots A_{n+m-1}$ and $A_{n+m} \ldots A_{n+m+k-1}$, respectively, and the cells arranged in matrix form are selected by the outputs of the decoder (X) 1 and the decoder (Y) 2. A presense amplifier 4 writes or reads the information out of or into the cell selected from the outputs of the decoder (X) 1 and the decoder (Y) 2. The read data are amplified by the sense amplifier 5. A hold current source 6 is provided for holding the information in the memory cell in the cell array 3.

The present invention will be explained with respect to the problem caused in the decoder circuit X(1) in the block diagram of FIG. 1. Hereinafter, the decoder circuit X(1) is called the decoder circuit.

Before explaining the present invention, a conventional two-stage H decoder will first be explained with reference to FIGS. 2 and 3. FIG. 2 is a circuit diagram of a conventional two-stage H decoder constructed to deal with addresses consisting of four bits, used in the memory device of FIG. 1. Referring to FIG. 2, four gate circuits $G_{00}$, $G_{01}$, $G_{02}$ and $G_{03}$ of the first stage are divided into two groups, i.e., a first high level selection circuit $HS_1$ comprising the gate circuits $G_{00}$ and $G_{01}$, and a second high level selection circuit $HS_2$ comprising the gate circuits $G_{02}$ and $G_{03}$. Gate circuits of the second stage are also divided into four groups GI, GII, GIII, and GIV. Each of the four groups GI, GII, GIII and GIV provides four outputs $D_{10}$ through $D_{13}$, $D_{14}$ through $D_{17}$, $D_{18}$ through $D_{21}$, or $D_{22}$ through $D_{25}$. Therefore, a total of sixteen outputs are provided in this decoder circuit. Input binary signals comprising four bits are divided into upper digits 0 and 1, and lower digits 2 and 3. The upper digits are fed to the upper gate circuit $G_{00}$ and $G_{01}$ of the first stage so that one of the outputs $V_{B0}$, $V_{B1}$, $V_{B2}$ and $V_{B3}$ will become a high potential level, while the other outputs will become ground potential. The lower digits are fed to the lower gate circuits $G_{02}$ and $G_{03}$ of the first stage so that their outputs are fed in parallel as decoding input signals to each of the gate circuits GI, GII, GIII and GIV of the second stage, whereby any one of the sixteen outputs of the gate circuits GI, GII, GIII and GIV is allowed to produce a high potential level.

When the input signals $A_0$, $A_1$, $A_2$ and $A_3$ are assumed to have L, H, L and L levels, respectively, where L denotes a low potential level and H denotes a high potential level, that is, when these input signals have logical values 0, 1, 0 and 0, respectively, the upper two bits 01 are supplied to the first gate circuits $G_{00}$ and $G_{01}$ in the first high level selection circuit $HS_1$, so that the transistors $Q_{2a}$ and $Q_{1b}$ are placed in an on state. Accordingly, in the decoder circuits $G_a$, $G_b$, $G_c$ and $G_d$, the diodes $d_{10}$, $d_{21}$, $d_{30}$ and $d_{31}$ are placed in an on state, so that the decoder circuit $G_a$ only generates an output having a high level. The outputs $V_{B0}$, $V_{B1}$, $V_{B2}$ and $V_{B3}$ of the decoder circuits are supplied to the electric source terminals $V_G$ of the second stage decoder circuits GI through GIV, and only the decoder circuit GI is placed in an operative condition and the other decoder circuits GII through GIV are placed in a non operative condition. Thus, the second stage decoder circuit GI is selected by the upper two bits of the input signal.

The lower two bits 00 of the input signal are supplied to the gate circuits $G_{02}$ and $G_{03}$ in the second high level selection circuit $HS_2$ so that the transistors $Q_{2c}$ and $Q_{2d}$ are placed in the on state. Accordingly, the diodes $d'_{10}$, $d'_{21}$, $d'_{30}$ and $d'_{31}$ in the gate circuit GI are placed in the on state, so that only the output $D_{10}$ is placed in the high level.

When the input signals $A_0$ through $A_3$ have another combination of H and L, similar to the above-mentioned operation any one of the outputs $D_{10}$ through $D_{25}$ of the second gate circuits GI through GIV is placed in the high level state, so that 16 pieces of information included in four bits binary signal can be decoded.

Since both of the two groups of the first stage are high level selection circuits as mentioned above, the two-stage H decoder as illustrated in FIG. 2 consumes a relatively large amount of electric power. For example, with respect to the second high level selection circuit $HS_2$ and the gate circuit GI, if the output $D_{10}$ is to be selected, the circuit $HS_2$ must conduct currents through diodes $d'_{10}$, $d'_{21}$, $d'_{30}$ and $d'_{31}$, which are connected to the other outputs $D_{11}$, $D_{12}$ and $D_{13}$, respectively, and only the diodes $d'_{00}$ and $d'_{01}$, which are connected to the output $D_{10}$, do not conduct any current therethrough so that the output $D_{10}$ is kept at a high potential level. Therefore, for the selection of one output, currents must be conducted through elements connected to the other three outputs. This results in a high power consumption.

Figure 4:
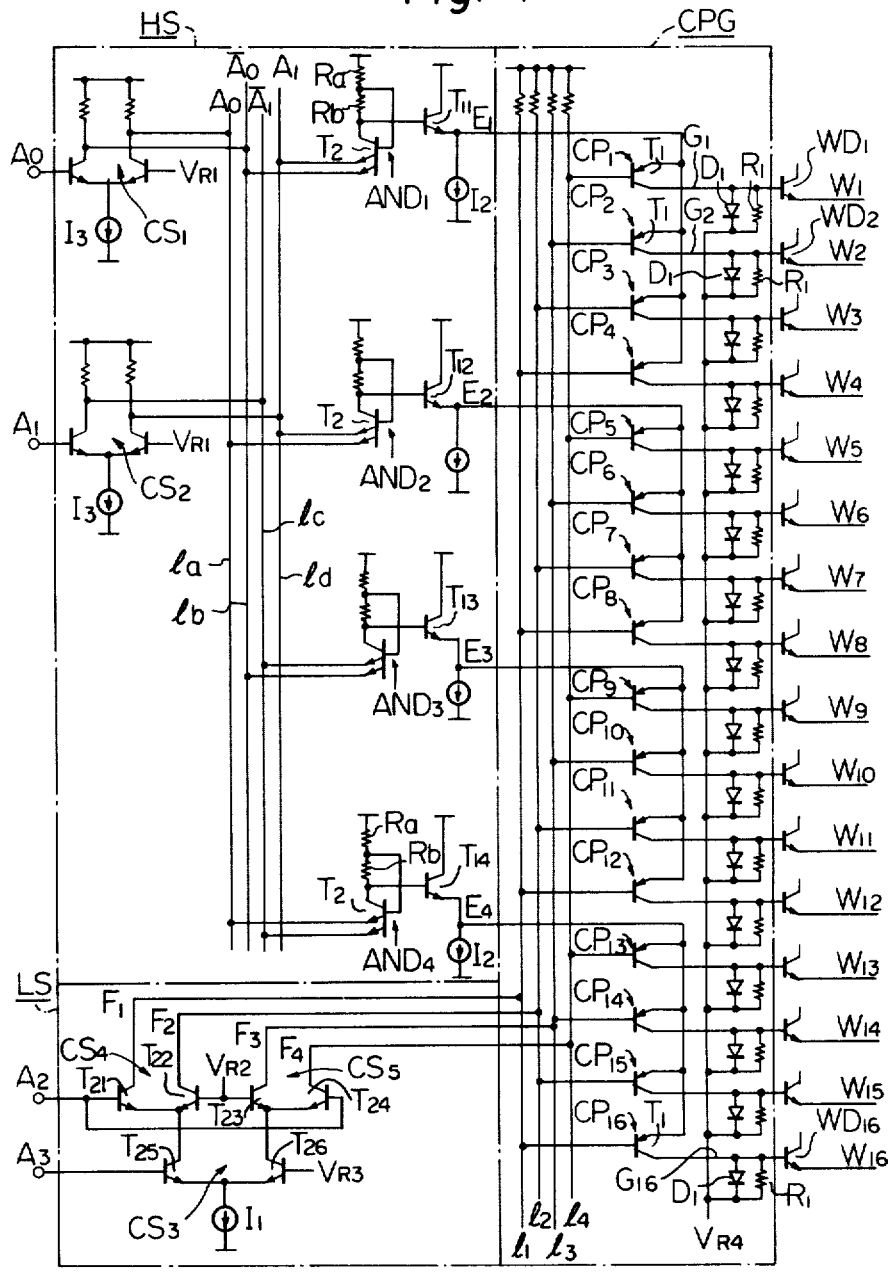
FIG. 4 is a circuit diagram of a decoder according to one embodiment of the present invention.

Furthermore, the two-stage H decoder of FIG. 2 presents another defect that the output waveform has a distortion as illustrated in FIG. 3. When the output rises from the low level to the high level, it should ideally rise as indicated by a dotted line. In practice, however, the output assumes a waveform as indicated by a solid line. Therefore, when the reading level is higher than a certain value, the access time tends to be delayed. The distortion in the output waveform is caused by the fact that the first high level selection circuit $HS_1$ must drive one of the four groups GI, GII, GIII and GIV and the high level selection circuit $HS_2$, so that the load capacitance of the first high level selection circuit $HS_1$ is too large to drive them smoothly. The present invention will now be explained with reference to the following embodiments. FIG. 4 illustrates a decoder circuit according to an embodiment of the present invention, in which, the decoder circuit receives, as an example, four-bit address signals $A_0$, $A_1$, $A_2$ and $A_3$ for word lines and selects any one of the sixteen word lines $W_1$ through $W_{16}$. Referring to FIG. 4, HS denotes a high level selection circuit (hereinafter referred to as an H selection circuit) for receiving the upper two bits of address signals $A_0$ and $A_1$ and selecting one of the four outputs $E_1$, $E_2$, $E_3$ and $E_4$ to be a high potential level (selected level), while the other three outputs are lowered to a low potential level (nonselected level). LS denotes a low level selection circuit (hereinafter referred to as an L selection circuit) for receiving the lower two bits of address signals $A_2$ and $A_3$ and selecting one of the four outputs $F_1$, $F_2$, $F_3$ and $F_4$ to be a low potential level (selected level), while the other three outputs remain at a high potential level (nonselected level). CPG represents a group of sixteen coupling circuits $CP_1$ through $CP_{16}$, for receiving the outputs $E_1$ through $E_4$ of the H selection circuit HS and the outputs $F_1$ through $F_4$ of the L selection circuit LS. One of the coupling circuit $CP_1$, $CP_2$, ..., or $CP_{16}$ is operated when it receives the H level output from the H selection circuit HS and L level output from the L selection circuit LS. When one of the coupling circuits is operated, then, one of the word lines $W_1$ through $W_{16}$ connected to the coupling circuit is selected. $WD_1$ through $WD_{16}$ represent word drivers corresponding to the word lines $W_1$ through $W_{16}$, respectively. The potential of the base $G_1$, $G_2$, ..., or $G_{16}$ of each word driver is controlled by the output of the corresponding coupling circuit $CP_1$, $CP_2$, ..., or $CP_{16}$. Each of the coupling ciruits $CP_1$ through $CP_{16}$ is comprised of a pnp transistor $T_1$ the collector of which is connected to the base of the corresponding word driver, and a bias circuit comprising a resistance $R_1$ and a diode $D_1$ connected in parallel, the anode of the diode $D_1$ being connected to the base of the corresponding word driver and the cathode of the diode $D_1$ being connected to a reference voltage source $V_{R4}$. The base and the emitter of each transistor $T_1$ are connected to different points in respective coupling circuits. That is the emitter of each transistor $T_1$ in the coupling circuits $CP_1$ through $CP_4$ is connected to the emitter of an npn transistor $T_{11}$ which provides the output $E_1$ of the H selection circuit HS. Similarly, the emitter of each transistor $T_1$ in the coupling circuit $CP_5$ through $CP_8$ is connected to the emitter of a transistor $T_{12}$; the emitter of each transistor $T_1$ in the coupling circuit $CP_9$ through $CP_{12}$ is connected to the emitter of a transistor $T_{13}$; and the emitter of each transistor $T_1$ in the coupling circuit $CP_{13}$ through $CP_{16}$ is connected to the emitter of a transistor $T_{14}$. The bases of the transistors $T_1$, in each group of the coupling circuits $CP_1$ through $CP_4$, $CP_5$ through $CP_8$, $CP_9$ through $CP_{12}$, or $CP_{13}$ through $CP_{16}$, are connected to bus lines $l_1$, $l_2$, $l_3$ and $l_4$, respectively, which receive the outputs $F_1$, $F_2$, $F_3$ and $F_4$ of the L selection circuit LS, respectively. That is, the bases of the transistors $T_1$ in the coupling circuits $CP_4$, $CP_8$, $CP_{12}$ and $CP_{16}$ are connected to the bus line $l_1$ which is connected to the collector of an npn transistor $T_{21}$ in the L selection circuit LS. Similarly, the bases of the transistors $T_1$ in the coupling circuits $CP_3$, $CP_7$, $CP_{11}$, and $CP_{15}$ are connected through the bus line $l_2$ to the collector of a transistor $T_{22}$ in the L selection circuit LS; the bases of the transistors $T_1$ in the coupling circuits $CP_2$, $CP_6$, $CP_{10}$ and $CP_{14}$ are connected through the bus line $l_3$ to the collector of a transistor $T_{23}$; and the bases of the transistors $T_1$ in the coupling circuits $CP_1$, $CP_5$, $CP_9$, and $CP_{13}$ are connected through the bus line $l_4$ to the collector of a transistor $T_{24}$.

The operation of the decoder circuit of FIG. 4 will now be explained. When the transistor $T_1$ in a coupling circuit $CP_i$ (where i=1, 2, ..., or 16) is in the OFF state, the reference voltage $V_{R4}$ is applied through a resistor $R_1$ to the base of the word driver $WD_i$. Since the reference voltage $V_{R4}$ is set at a low level, the output of the word driver $WD_i$, that is, the word line $W_i$ is the L level (non-selected level). In contrast to this, when the transistor $T_1$ is turned on, a current will flow from a power supply through the H selection circuit HS, the transistor $T_1$, and the diode $D_1$ to reference voltage source $V_{R4}$, so that the base potential of the word driver $WD_i$ will increase by the amount of the forward voltage of the diode $D_1$, resulting in that the potential of the word line $W_i$ is increased to the selected high level. The potential of the base of the word driver $WD_i$ is practically between $-1.2$ and $-1.6$ volts for the high level and between $-2.0$ and $-2.4$ volts for the low level. The reference voltage $V_{R4}$ is the same as the potential of the base of the word driver $WD_i$ for the low level. The transistor $T_1$ is turned on only when its emitter potential is the high level and its base potential is the low level. This condition can be realized in only one coupling circuit among the sixteen coupling circuits $CP_1$ through $CP_{16}$, as can be seen from the illustrated circuit diagram when considering the output situations of the H selection circuits HS and the L selection circuit LS.

The H selection circuit HS comprises a first current switch $CS_1$, or, in other words, a first address inverter $CS_1$, which provides the address signal $A_0$ and its inverter signal $\overline{A_0}$ by comparing the address signal $A_0$ with a reference voltage $V_{R1}$; a second current switch $CS_2$, *that is, a second address inverter $CS_1$*, which provides the address signal $A_1$ and its inverted signal $\overline{A_1}$, and; four AND gates $AND_1$, $AND_2$, $AND_3$; and $AND_4$, each of which is comprised of a multiemitter transistor $T_2$ for receiving two predetermined inputs of the four address signals $A_0$, $\overline{A_0}$, $A_1$ and $\overline{A_1}$. The outputs of the AND gates $AND_1$ through $AND_4$ control the base potentials of transistors $T_{11}$, $T_{12}$, $T_{13}$ and $T_{14}$ which provide the four outputs $E_1$, $E_2$, $E_3$ and $E_4$ of the H selection circuit HS, respectively. $I_2$ and $I_3$ represent constant current sources. $R_B$ and $R_C$ represent resistances. When both of two inputs of an AND gate $AND_n$, where n is 1, 2, 3, or 4, are high level H, the AND gate $AND_n$ provides a high level output, which is supplied to the base of the transistor $T_{1n}$ to turn it on so that its output $E_n$ becomes the high level. Only one of the four AND gates receives the high level signal at its two inputs. Therefore, only one of the four outputs $E_1$, $E_2$, $E_3$ and $E_4$ becomes the high level, while the other three outputs remain in the low level.

The L selection circuit LS is a circuit of a series gate type and is comprises; a third current switch $CS_3$ including transistors $T_{25}$ and $T_{26}$ for comparing the input signal $A_3$ with a reference voltage $V_{R3}$; a fourth current switch $CS_4$, which is operative when the transistor $T_{25}$ is in the ON state, for comparing the input signal $A_2$ with a reference voltage $V_{R2}$; a fifth current switch $CS_5$, which is operative when the transistor $T_{26}$ is in the ON state, for comparing the input signal $A_2$ with the reference voltage $V_{R2}$; and a constant current source $I_1$ connected to the emitters of the transistors $T_{25}$ and $T_{26}$. When the address signals $A_2$ and $A_3$ are supplied to the L selection circuit, only one transistor $T_{2m}$ of the four transistors $T_{21}$, $T_{22}$, $T_{23}$ and $T_{24}$, and only one transistor of the two transistors $T_{25}$ and $T_{26}$ will be turned on so that a current will flow through the transistor $T_{2m}$ to the current source $I_1$, causing the output $F_m$ of the transistor $T_{2m}$ to go to a low level L, while the other three outputs remain at a high level H.

When the address signals $A_0$ and $A_1$ are supplied to the H selection circuit HS, only one selected AND gate $AND_n$ and the transistor $T_{1n}$ connected to the AND gate $AND_n$ are not turned on, and the other three non selected AND gates and the transistors connected to them are turned on so that currents flow therethrough. In contrast to this, when the address signals $A_2$ and $A_3$ are supplied to the L selection circuit LS, only one transistor $T_{2m}$ (m=1, 2, 3 or 4) and the transistor $T_{25}$ or $T_{26}$ connected to the transistor $T_{2m}$ are turned on to conduct a current therethrough, and the other transistors are not turned on. Therefore, the L selection circuit LS consumes a relatively small amount of electric power in comparison with the H selection circuit. In the conventional two-stage H decoder, the H selection circuit HS was used in place of the L selection circuit LS. Therefore, the power consumption in the decoder circuit according to the present invention is reduced to about half of the power consumption in the conventional two-stage H decoder.

Furthermore, the decoder circuit according to the present invention has another advantage of having output waveforms which rise and fall rapidly without any distortion. This advantage is also due to the employment of the H selection circuit HS and the L selection circuit LS. That is, in the decoder circuit according to the present invention, the H selection circuit HS may only drive a part of the coupling circuit group CPG. Therefore, the load capacitance of the H selection circuit HS is sufficiently low for the driving capacity of the circuit HS. Since the output waveform has no distortion, the output waveform rises or falls rapidly, and, the rise or fall time can be shortened by about 5 ns in comparison with the conventional two-stage H decoder, when these decoders are applied to a 4K memory cell.

The rise or fall time of the output waveform can also be shortened because the amplitude of the output signal at each output of the H selection circuit HS or the low level selection circuit LS may be only half of the amplitude required in the conventional decoder circuits. That is, in general, a decoder circuit has a large parasitic capacitance which causes a large time constant. In order to obtain a predetermined amplitude, for example, 0.8 volts, of the word line for accurately driving the memory cells, a large amplitude was required for the signal in the conventional decoder circuit. Therefore, due to the large time constant, the access time to the memory cells tends to be delayed in the conventional decoder circuit. In contrast to this, however, according to the present invention, since the emitter and the base potentials of each transistor $T_1$ in the coupling circuit group CPG are supplied from the H selection circuit HS and the L selection circuit LS, respectively, the required amplitude of each output $E_1$, $E_2$, $E_3$ or $E_4$, or, $F_1$, $F_2$, $F_3$ or $F_4$ is only half of the potential difference between the emitter and the base of the transistor $T_1$ for completely turning it on. For example, when a potential difference of 0.8 volts is required to turn on the transistor $T_1$, the amplitude of each output of the H selection circuit HS and the L selection circuit LS may be 0.4 volts, and therefore, a rapid rise or fall of the output waveform can be obtained.

The small voltage amplitude in the decoder circuit also causes a low power consumption.

As a practical example, let it be assumed that the transistor $T_1$ in the coupling circuit $CP_1$ is to be turned on. In this case, the high level at the output of the AND gate $AND_1$ is 0 volts. Therefore, the high level at the output $E_1$ is $-0.8$ volts. The potential at the output $E_1$ is applied as the high level to the emitter of the transistor $T_1$ in the coupling circuit $CP_1$. On the other hand, in an off state of the AND gate $AND_1$, the low level at the output $E_1$ must be lower than the high level by the amount of 0.4 volts, and therefore, is $-1.2$ volts. Thus, the low level at the output of the AND gate $AND_1$ is $-0.4$ volts. Accordingly, the amplitude of the potential at the collector of the AND gate $AND_1$ is equal to 0.4 volts, while in the conventional decoder circuit, the amplitude is required to be 0.8 volts.

The amplitude of the potentials between the high level and the low level at the collector of each AND gate $AND_n$ determines the amplitudes of bus lines la, lb, lc and ld. Therefore, the amplitudes of the bus lines la, lb, lc and ld can also be reduced according to the present invention. In addition, the amplitude of each bus line la, lb, lc or ld can be made smaller than the amplitude of each output $E_1$, $E_2$, $E_3$ or $E_4$, which is equal to 0.4 volts as mentioned above. That is, resistances Ra and Rb connected to the collector of the transistor $T_2$ in each AND gate, function as a potential divider, so that the required amplitude of each bus line la, lb, lc or ld is $E \cdot Ra/(Ra+Rb)$, where E is the amplitude of the output $E_n$ of the H selection circuit HS. In conventional decoder circuits, such potential dividers were also used to reduce the amplitudes of bus lines. However, since the amplitude of the collector of each transistor was twice that of the present invention, the potential at the base of each transistor could not be much smaller. If the potential at the base of each transistor is largely reduced by increasing the dividing ratio of the potential divider, the transistor will be saturated so, that the operating speed of the transistor is reduced. Therefore, the dividing ratio could not be increased as much and thus the amplitudes of the bus lines could not be reduced as much as in the present invention. In contrast to this, according to the present invention, the amplitudes of the bus lines la, lb, lc and ld can be greatly reduced without causing the problem of the saturation of the transistor $T_2$.

With respect to the amplitude of the base potential of each transistor $T_1$ in the coupling circuit group CPG, similar explanation as mentioned above with respect to the amplitude of the emitter potential of each transistor $T_1$ can be applied. Thus, the amplitude of the potential of the base of each transistor $T_1$ can also be reduced according to the present invention. The base of each transistor $T_1$ is connected to the bus line $l_1$, $l_2$, $l_3$ or $l_4$. Therefore, the amplitude of each bus line $l_1$, $l_2$, $l_3$ or $l_4$ is also reduced. Although the bus lines $l_1$, $l_2$, $l_3$ and $l_4$ have large load capacitances, the operating speed of the decoder circuit according to the invention is increased because of the reduced amplitudes of the bus lines. For practical values, the high level and the low level of the base potential of the transistor $T_1$ are $-1.6$ volts and $-2.0$ volts, respectively. The L selection circuit LS provides the high level potential and the low level potential. The high level and the low level of the base potential $G_i$ of each word driver $WD_i$ are $-1.2$ volts and $-2.0$ volts, respectively. The reference voltage $V_{R4}$ is $-2.0$ volts.

Other advantages can also be obtained by using the decoder circuit according to the present invention. First, since the pnp transistor $T_1$ is used in each coupling circuit, the word driver $WD_i$ has no load resistance at its base, when the decoder circuit is seen from the side of the word line $W_i$. Because of this, rapid access to the memory cells can also be effected. The resistance $R_1$ connected between the base of each word driver $WD_i$ and the reference voltage source $V_{R4}$ does not function as a load when the word line $W_i$ is driven, because the resistance $R_1$ only functions to provide the low level potential to the base of the word driver $WD_i$. Secondly, since the L selection circuit LS is the series gate type, only one constant current source $I_1$ is required. Therefore, the number of elements in the decoder circuit is reduced so that the power consumption is reduced. Thirdly, since the nonselected level of each word line $W_i$ is determined by the single reference voltage $V_{R4}$, the nonselected level is constant for all of the word lines $W_1$ through $W_{16}$. This constant nonselected level also results in high speed of access to the memory cells, and also results in an increase in the reliability of the operation of the memory cells.

Figure 5:
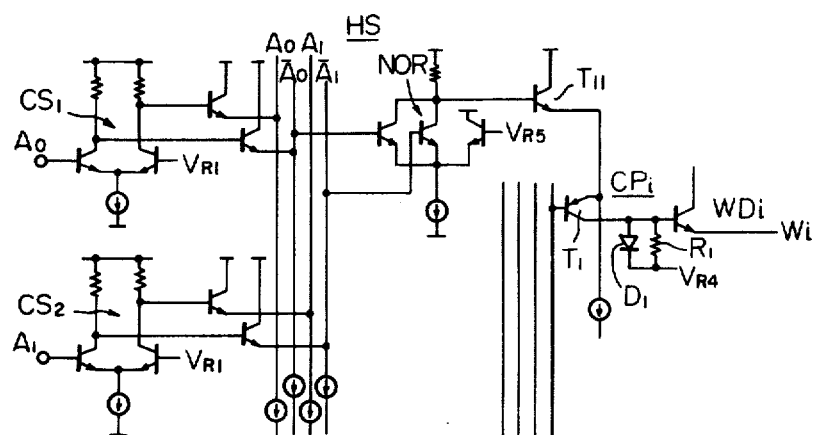
FIG. 5 is a circuit diagram illustrating a main portion of a decoder according to another embodiment of the present invention.
Figure 5:
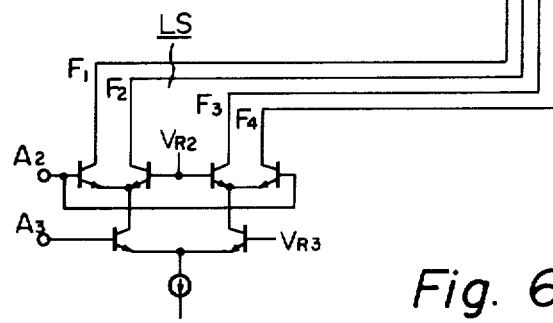

FIG. 5 is a circuit diagram illustrating a main portion of a decoder according to another embodiment of the present invention. Referring to FIG. 5, the logical construction of an H selection circuit HS' differs from the H selection circuit HS in the decoder circuit of FIG. 4. In FIG. 5, NOR denotes one of four NOR gates for receiving two of the four address signals $A_0$, $\bar{A}_0$, $A_1$, and $\bar{A}_1$. In this embodiment, the NOR gate receives the address signals $A_0$ and $A_1$. When both of the two inputs are the low level, the NOR gate provides an output of high level. In the other cases, the NOR gate provides an output of the low level. These NOR gates correspond to the AND gates in the circuit of FIG. 4. That is, the NOR gate and the AND gate provide the high level outputs, respectively, only when its two outputs are both low level and high level, respectively.

The other known high level selection circuits may also be used in the decoder circuit according to the present invention, with the same effects as obtained by the decoder circuit of FIG. 4.

Figure 6:
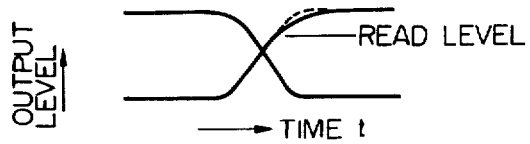
FIG. 6 is a graph illustrating the waveform of the decoder circuit according to the present invention.

FIG. 6 is a diagram illustrating the output waveform of the decoder circuit according to the present invention. By comparing the diagram of FIG. 6 with the diagram of FIG. 3 of the conventional decoder circuit, it is apparent that, according to the present invention, the output waveform has no distortion and rises or falls rapidly.

From the foregoing description, it will be apparent that, in the decoder circuit according to the present invention, the operating speed is greatly increased and the power consumption is largely reduced.

It should be noted that, although the bit number of address signals is four bits in the illustrated embodiments, any bit number may be allowed by increasing or decreasing the number of elements in the decoder circuit. Also, with respect to the input signals, the number of upper bits must not always be equal to the number of lower bits.

I claim:

1. A decoder circuit operatively connectable to receive a plurality of address signals having first and second parts and operatively connectable to $n \times m$ word lines having n first word line groups and m second word line groups, where n and m are integers, said decoder circuit for selecting one of the $n \times m$ word lines and for driving a semiconductor memory device, said decoder circuit comprising:
   a high level selection circuit, operatively connectable to receive the first part of said plurality of address signals, for generating a first level output signal for specifying one of the n first word line groups, and for generating $(n-1)$ second level output signals for the rest of the n first word line groups;
   a low level selection circuit, operatively connectable to receive the second part of said plurality of address signals, for generating a second level output signal for specifying one of the m second word line groups, and for generating $(m-1)$ first level output signals for the rest of the m second word line groups; and
   $n \times m$ coupling circuits each operatively connected to a corresponding one of the outputs of said high level selection circuit, to a corresponding one of the outputs from said low level selection circuit and to a corresponding one of said $n \times m$ word lines, each of said $n \times m$ coupling circuits selecting the corresponding word line when the first level output signal from said high level selection circuit and the second level output signal from said low level selection circuit are simultaneously applied to the corresponding one of said $n \times m$ coupling circuits.

2. A decoder circuit as claimed in claim 1, wherein each of the $n \times m$ word lines has a word driver, wherein each of said $n \times m$ coupling circuits comprises a pnp transistor having an emitter operatively connected to one of the outputs of said high level selection circuit, having a base operatively connected to one of the outputs of said low level selection circuit, and having a collector operatively connected to each of the $n \times m$ word drivers.

3. A decoder circuit as claimed in claim 2, further comprising resistors, wherein the collectors of all of said pnp transistors are operatively connected to one side of said resistors, respectively, and the other side of said resistors having applied thereto a reference voltage source.

4. A decoder circuit as claimed in claim 1, wherein said low level selection circuit comprises a plurality of current switches, operatively connected in a series gate type configuration, said series gate type current switch configuration operatively connected to said $n \times m$ coupling circuits and operatively connectable to receive the second part of said plurality of address signals, for generating said second level output signal and said $(m-1)$ first level output signals.

5. A decoder circuit as claimed in claim 4, wherein each of said current switches comprise a pair of npn transistors, the emitters of said pair of npn transistor being operatively connected to each other, the base of one of said pair of npn transistors operatively connectable to receive one of said plurality of address signals, the base of the other of said pair of npn transistors having applied thereto a reference voltage, and wherein the outputs of said low level selection circuit are the collectors of said npn transistors.

6. A decoder circuit as claimed in claim 4, wherein said low level selection circuit further comprises a constant current source, operatively connected to said plurality of current switches, for driving said plurality of current switches.

7. A decoder circuit as claimed in claim 1, wherein said high level selection circuit generates decoded signals having the first level from said plurality of address signals, wherein said high level selection circuit comprises a plurality of AND gates, operatively connected to said $n \times m$ coupling circuits, each of said AND gates having two inputs for receiving the decoded signals decoded from one of said plurality of address signals and having an output for outputting the first level output signal of said high level selection circuit only when said two inputs are the first level.

8. A decoder circuit as claimed in claim 1, wherein said high level selection circuit generates decoded signals having the second level from said plurality of address signals, wherein said high level selection circuit comprises a plurality of NOR gates, operatively connected to said $n \times m$ coupling circuits, each of said NOR gates having two inputs for receiving the decoded signals decoded from one of said plurality of address signals and having an output for outputting the first level output signal of said high level selection circuit only when said two inputs are the second level.

9. A decoder circuit, operatively connectable to receive an address signal having first and second parts, for selecting one of $n \times m$ word lines, the word lines being divided into n word line groups of m word lines each and m word line groups of n word lines each, where n and m are integers, so that one of the word lines belongs to both one of the n word line groups and one of the m word line groups, said decoder circuit comprising:
   a high level selection circuit, operatively connectable to receive the first part of said address signal, for generating a first selection signal for specifying one of the n word line groups;
   a low level selection circuit, operatively connectable to receive the second part of said address signal, for generating a second selection signal for specifying one of the m word line groups; and
   $n \times m$ coupling circuits, each operatively connected to said high level selection circuit, said low level selection circuit, and one of the $n \times m$ word lines, for selecting one of the n×m word lines in dependence upon the first and second selection signals.

10. A decoder circuit as claimed in claim 9, wherein said n×m coupling circuits being divided into n coupling circuit groups of m coupling circuits and m coupling circuit groups of n coupling circuits, so that one of said n×m coupling circuits belongs to both one of the n word line groups and one of the m word line groups, wherein said high level selection circuit comprises:

an inverter operatively connectable to receive the first part of said address signal; and a logic circuit operatively connected to said inverter and to one of the n coupling circuit groups.

11. A decoder circuit as claimed in claim 9, wherein said n×m coupling circuits being divided into n coupling circuit groups of m word lines and m coupling circuit groups of n word lines, so that one of said n×m coupling circuits belongs to both one of the n word line groups and one of the m word line groups, wherein said low level selection circuit comprises a current switch operatively connectable to receive the second part of said address signal and operatively connected to one of the m coupling circuit groups.

* * * * *